(12) United States Patent
Katsui et al.

(10) Patent No.: US 11,814,126 B2
(45) Date of Patent: Nov. 14, 2023

(54) DRIVER ALERT SYSTEM

(71) Applicant: SEMICONDUCTOR ENERGY LABORATORY CO., LTD., Atsugi (JP)

(72) Inventors: Shuichi Katsui, Kanagawa (JP); Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 420 days.

(21) Appl. No.: 17/275,236

(22) PCT Filed: Oct. 1, 2019

(86) PCT No.: PCT/IB2019/058317
§ 371 (c)(1),
(2) Date: Mar. 11, 2021

(87) PCT Pub. No.: WO2020/074998
PCT Pub. Date: Apr. 16, 2020

(65) Prior Publication Data
US 2022/0041242 A1 Feb. 10, 2022

(30) Foreign Application Priority Data

Oct. 11, 2018 (JP) ................................. 2018-192548

(51) Int. Cl.
*B62J 50/21* (2020.01)
*G01S 15/04* (2006.01)
(Continued)

(52) U.S. Cl.
CPC ............... *B62J 50/21* (2020.02); *G01S 7/526* (2013.01); *G01S 15/04* (2013.01); *G01S 15/931* (2013.01);
(Continued)

(58) Field of Classification Search
CPC ............ B62J 3/14; G01S 15/04; G01S 15/031
See application file for complete search history.

(56) References Cited

U.S. PATENT DOCUMENTS 9,541,386 B2    1/2017  Kurokawa
2009/0033475 A1*  2/2009  Zuziak ..................... B62J 3/10
                                                       340/432
(Continued)

FOREIGN PATENT DOCUMENTS

CN     102069866 A  *  5/2011
CN     104345994 A      2/2015
(Continued)

OTHER PUBLICATIONS

International Search Report (Application No. PCT/IB2019/058317) dated Dec. 24, 2019.
(Continued)

*Primary Examiner* — Kevin Kim
(74) *Attorney, Agent, or Firm* — Fish & Richardson P.C.

(57) ABSTRACT

To provide a driver alert system capable of improving the safety. A bicycle includes a first transmission circuit transmitting a first ultrasonic wave, a first receiving circuit receiving a second ultrasonic wave, an arithmetic circuit detecting the presence or absence of an object from the second ultrasonic wave, and a second transmission circuit transmitting a third ultrasonic wave. A driver wears a second housing including a second receiving circuit receiving the third ultrasonic wave. The arithmetic circuit includes a first selection circuit selecting a potential based on the second ultrasonic wave at a different timing, a plurality of signal retention circuits retaining a potential based on the second ultrasonic wave, a second selection circuit selecting any one of the plurality of signal retention circuits, and a signal processing circuit to which a signal selected in and output from the second selection circuit is input. The second selection circuit selects the plurality of signal retention circuits at different timings to generate a signal obtained by delaying the second ultrasonic wave. The third ultrasonic
(Continued)

wave generated on the basis of the signal is transmitted to the second housing.

12 Claims, 14 Drawing Sheets

(51) Int. Cl.
  *G01S 15/931* (2020.01)
  *G01S 7/526* (2006.01)
  *H01L 27/06* (2006.01)
  *H01L 29/786* (2006.01)

(52) U.S. Cl.
  CPC ...... *H01L 27/0688* (2013.01); *H01L 29/7869* (2013.01)

(56) References Cited

U.S. PATENT DOCUMENTS

| | | |
|---|---|---|
| 2013/0250274 A1 | 9/2013 | Kurokawa |
| 2015/0028213 A1 | 1/2015 | Weinberg et al. |

FOREIGN PATENT DOCUMENTS

| | | |
|---|---|---|
| JP | 09-281220 A | 10/1997 |
| JP | 11-023697 A | 1/1999 |
| JP | 2002-101165 A | 4/2002 |
| JP | 2003-026064 A | 1/2003 |
| JP | 2003-240850 A | 8/2003 |
| JP | 2013-224931 A | 10/2013 |
| JP | 2017-206242 A | 11/2017 |
| JP | 2017-223697 A | 12/2017 |
| JP | 2019-060898 A | 4/2019 |
| KR | 2013-0107245 A | 10/2013 |

OTHER PUBLICATIONS

Written Opinion (Application No. PCT/IB2019/058317) dated Dec. 24, 2019.

* cited by examiner

DRIVER ALERT SYSTEM

CROSS REFERENCE TO RELATED APPLICATIONS

This application is a U.S. National Phase Application under 35 U.S.C. § 371 of International Application PCT/IB2019/058317, filed on Oct. 1, 2019, which is incorporated by reference and claims the benefit of a foreign priority application filed in Japan on Oct. 11, 2018, as Application No. 2018-192548.

TECHNICAL FIELD

One embodiment of the present invention relates to a driver alert system.

BACKGROUND ART

Bicycle driver alert systems have been researched and developed (e.g., Patent Document 1). Patent Document 1 discloses a structure in which a microwave ultrasonic wave radar is provided on a bicycle as a proximity sensor and the front and the backward are monitored by echolocation. Patent Document 1 also discloses a structure in which an alert is given to a driver by vibrating a vibration motor provided on handlebars in accordance with information detected with the proximity sensor.

REFERENCE

Patent Document

[Patent Document 1] Japanese Published Patent Application No. 2017-206242

SUMMARY OF THE INVENTION

Problems to be Solved by the Invention

A driver recognizes an alert based on information acquired by a sensor or the like. In order that the driver recognizes the alert more easily, an alerting device is preferably capable of being attached to a body, that is, a wearable device. However, when the wearable device has high power consumption and a large circuit area, for example, when the wearable device includes a processor or an A/D conversion circuit, the wearable device might be increased in size.

An object of one embodiment of the present invention is to provide a driver alert system with a novel structure which enables size reduction. Another object of one embodiment of the present invention is to provide a driver alert system with a novel structure which can reduce power consumption. Another object of one embodiment of the present invention is to provide a driver alert system with a novel structure which can improve safety.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a driver alert system including a first housing and a second housing. The first housing includes a first transmission circuit transmitting a first ultrasonic wave, a first receiving circuit receiving a second ultrasonic wave, an arithmetic circuit detecting the presence or absence of an object from the second ultrasonic wave, and a second transmission circuit transmitting a third ultrasonic wave on the basis of a signal obtained in the arithmetic circuit. The second housing includes a second receiving circuit receiving the third ultrasonic wave. The arithmetic circuit includes a first selection circuit selecting a potential based on the second ultrasonic wave at a different timing, a plurality of signal retention circuits retaining a potential based on the second ultrasonic wave, a second selection circuit selecting any one of the plurality of signal retention circuits, and a signal processing circuit to which a signal selected in and output from the second selection circuit is input. Each of the plurality of signal retention circuits includes a first transistor. The second ultrasonic wave is an ultrasonic wave obtained by reflection of the first ultrasonic wave. The first transistor includes a semiconductor layer including an oxide semiconductor in a channel formation region. The second selection circuit selects the plurality of signal retention circuits at different timings to generate a signal obtained by delaying the second ultrasonic wave. The third ultrasonic wave generated on the basis of the signal is transmitted to the second housing.

One embodiment of the present invention is a driver alert system including a first housing and a second housing. The first housing includes a first transmission circuit transmitting a first ultrasonic wave, a first receiving circuit receiving a second ultrasonic wave, a second transmission circuit transmitting a third ultrasonic wave, a second receiving circuit receiving a fourth ultrasonic wave, an arithmetic circuit detecting the presence or absence of an object from the second ultrasonic wave and the fourth ultrasonic wave, and a third transmission circuit transmitting a fifth ultrasonic wave on the basis of a signal obtained in the arithmetic circuit. The second housing includes a third receiving circuit receiving the fifth ultrasonic wave. The arithmetic circuit includes a first selection circuit selecting a potential based on the second ultrasonic wave or the fourth ultrasonic wave at a different timing, a plurality of signal retention circuits retaining a potential based on the second ultrasonic wave or the fourth ultrasonic wave, a second selection circuit selecting any one of the plurality of signal retention circuits, and a signal processing circuit to which a signal selected in and output from the second selection circuit is input. The second ultrasonic wave is an ultrasonic wave obtained by reflection of the first ultrasonic wave. The fourth ultrasonic wave is an ultrasonic wave obtained by reflection of the third ultrasonic wave. Each of the plurality of signal retention circuits includes a first transistor. The first transistor includes a semiconductor layer including an oxide semiconductor in a channel formation region. The second selection circuit selects the plurality of signal retention circuits at different timings to generate a signal obtained by delaying the second ultrasonic wave or the fourth ultrasonic wave. The fifth ultrasonic wave generated on the basis of the signal is transmitted to the second housing.

In the driver alert system of one embodiment of the present invention, the first transistor preferably functions as a selection switch in the first selection circuit.

In the driver alert system of one embodiment of the present invention, each of the plurality of signal retention circuits preferably includes an amplifier circuit including a second transistor, and the second transistor preferably includes a semiconductor layer including an oxide semiconductor in a channel formation region.

In the driver alert system of one embodiment of the present invention, the second selection circuit preferably includes a third transistor, and the third transistor preferably includes a semiconductor layer including an oxide semiconductor in a channel formation region.

In the driver alert system of one embodiment of the present invention, it is preferable that the signal processing circuit include a differential circuit, an integration circuit, a comparator, and a triangular wave generator circuit, a first voltage and a second voltage be input to the differential circuit, an output signal of the differential circuit be input to the integration circuit, and an output signal of the integration circuit and an output signal of the triangular wave generator circuit be input to the comparator.

Note that other embodiments of the present invention are disclosed in the following embodiments and the drawings.

Effect of the Invention

According to one embodiment of the present invention, a driver alert system with a novel structure which enables size reduction can be provided. According to one embodiment of the present invention, a driver alert system with a novel structure which can reduce power consumption can be provided. According to one embodiment of the present invention, a driver alert system with a novel structure which can improve safety can be provided.

Note that the description of these effects does not disturb the existence of other effects. One embodiment of the present invention does not necessarily achieve all the effects. Other effects will be apparent from and can be derived from the description of the specification, the drawings, the claims, and the like.

MODE FOR CARRYING OUT THE INVENTION

Figure 1A:
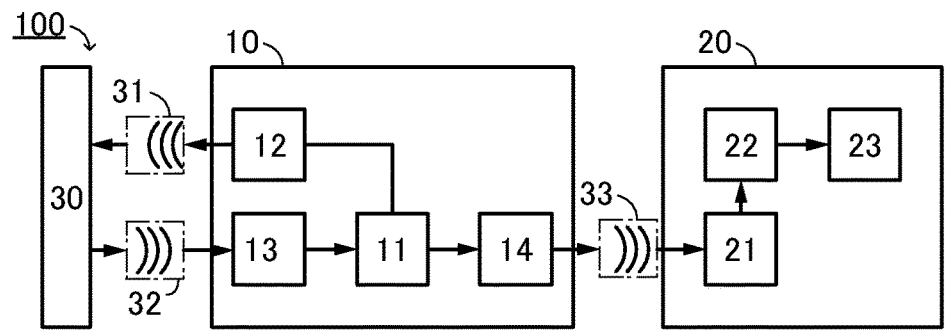
FIG. 1A, FIG. 1B, and FIG. 1C each illustrate a structure of a driver alert system.

Embodiments will be described below with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the following description of the embodiments.

In this specification and the like, ordinal numbers such as "first," "second," and "third" are used in order to avoid confusion among components. Thus, the terms do not limit the number or order of components. For example, in this specification and the like, a "first" component in one embodiment can be referred to as a "second" component in other embodiments or claims. Alternatively, for example, in this specification and the like, a "first" component in one embodiment can be omitted in other embodiments or claims.

In the drawings, the same components, components having similar functions, components formed using the same material, or components formed at the same time are denoted by the same reference numerals, and the description thereof is not repeated in some cases.

Embodiment 1

Structures and operations of a driver alert system of one embodiment of the present invention will be described with reference to FIG. 1 to FIG. 9. The driver alert system of one embodiment of the present invention has a function of an echolocation device which delays a signal obtained by receiving an ultrasonic wave and detects the presence or absence of an object and the distance to the object by comparing with a reference signal.

A driver alert system 100 illustrated in FIG. 1A includes a housing 10 and a housing 20. The housing 10 includes an arithmetic circuit 11, an transmission circuit 12, a receiving circuit 13, and an transmission circuit 14. The housing 20 includes a receiving circuit 21, a control circuit 22, and a vibration motor 23.

The housing 10 corresponds to a frame or handlebars of a bicycle or the like. Alternatively, the housing 10 corresponds to a device that is attachable to a frame or handlebars of a bicycle or the like. Components, such as the arithmetic circuit 11, the transmission circuit 12, the receiving circuit 13, and the transmission circuit 14, can be provided inside or outside the housing 10. The housing 10 is part of a moving object like a bicycle which is operated by a driver wearing a wearable housing such as a helmet. In addition to a bicycle, a motorcycle, an electric bicycle, and the like can be given as examples of the moving object.

The housing 20 corresponds to the one that a driver can wear such as a helmet or a wristwatch. Each of the receiving circuit 21, the control circuit 22, and the vibration motor 23 can be provided inside or outside the housing 20. The housing 20 is an electronic device that a driver can wear. Examples of the electronic device include a watch-type, a head-mounted, a goggle-type, a glasses-type, an armband-type, a bracelet-type, and a necklace-type wearable electronic terminals.

The receiving circuit 21 of the housing 20 receives an ultrasonic wave 33 transmitted from the transmission circuit 14 of the housing 10. The control circuit 22 has a function of determining whether the vibration motor 23 is booted in accordance with the received ultrasonic wave 33. Note that the vibration motor 23 is an example of a structure for alerting detection of an object to a driver, and another structure can be employed.

The arithmetic circuit 11 has a function of outputting an ultrasonic wave 31 through the transmission circuit 12. The ultrasonic wave 31 is reflected by an object 30 to become an ultrasonic wave 32. The ultrasonic wave 32 which is a reflected wave of the ultrasonic wave 31 can be observed by the receiving circuit 13. The arithmetic circuit 11 delays a signal obtained by receiving the ultrasonic wave 32 through the receiving circuit 13, and compares the signal with reference signals with different frequency, pulse repetition rate, wavelength, or the like. The arithmetic circuit 11 acquires information about the presence or absence of the object 30 and the distance to the object 30, depending on the comparison results. The information is overlapped with the ultrasonic wave 33 and transmitted to the housing 20 through the transmission circuit 14.

The transmission circuit 12 and the transmission circuit 14 each have a circuit configuration in which an ultrasonic vibrator transmits an ultrasonic wave. The receiving circuit 13 and the receiving circuit 21 each have a circuit configuration in which an ultrasonic wave is received.

The ultrasonic wave 31 is a sound wave with a frequency of 20 kHz or higher transmitted in a pulsed manner. By employing this frequency, a sound wave with directivity can be transmitted to detect an object using a reflected wave. It is preferable that the pulse repetition rate of the ultrasonic wave 31 can be changed within a range higher than or equal to 5 Hz and lower than or equal to 100 Hz. The distance to the object 30 which can be measured is changed depending on the pulse repetition rate. For this reason, the pulse repetition rate is preferably changed in accordance with the speed of the housing 10 or the presence or absence of the object 30.

The ultrasonic wave 32 is the ultrasonic wave 31 whose pulse frequency, pulse repetition rate, amplitude, wavelength, or the like is changed depending on Doppler effect caused by relative velocity between the housing 10 and an object, absorption attenuation in the air changed by ambient temperatures, acoustic impedance of the object 30, or the like.

The ultrasonic wave 33 is a signal with which information about the presence or absence of the object 30 and the distance from the housing 10 to the object 30 can be overlapped. A signal with another frequency (an RF band or a UHF band) can be used depending on the distance between the housing 10 and the housing 20.

A configuration example of the arithmetic circuit 11 is described with reference to the block diagram in FIG. 1B. The arithmetic circuit 11 includes a signal generation circuit 40, a delay circuit 41, and a signal processing circuit 42. The delay circuit 41 includes a selection circuit 111, a plurality of signal retention circuits 112, and a selection circuit 113.

Note that when one of the signal retention circuits 112 needs to be specified, description is made using the reference numeral of the signal retention circuit 112, and when a given signal retention circuit is referred, description is made using reference numerals of a signal retention circuit 112_1, a signal retention circuit 112_2, and the like. The same can be applied to other components, and a reference numeral such as "_2" or [1] is used to distinguish a plurality of components.

The signal generation circuit 40 is a circuit that generates a signal for transmitting the ultrasonic wave 31 through the transmission circuit 12. The signal generation circuit 40 is a circuit that outputs a signal W and a signal S which control a delay circuit on the basis of a signal output to the transmission circuit 12.

The receiving circuit 13 generates a signal $S_{IN}$ that is an analog electric signal (analog signal) obtained by receiving the ultrasonic wave 32. The delay circuit 41 is preferably provided for each receiving circuit 13.

The selection circuit 111 (also referred to as a first selection circuit) has a function of a demultiplexer that distributes the signals $S_{IN}$ to the plurality of signal retention circuits 112. The selection circuit 111 has a function of a switch, and on/off is controlled by a selection signal W. The selection circuit 111 is composed of n-channel transistors, for example.

The plurality of signal retention circuits 112 have functions of retaining analog voltages corresponding to the signals $S_{IN}$ and outputting voltages depending on the analog voltages. An analog voltage is written to the signal retention circuit 112 by turning on the switch of the selection circuit 111 at a predetermined timing and sampling the signal $S_{IN}$. Writing an analog voltage to the signal retention circuit 112 can be controlled by setting the selection signal W to the H level. Retaining the analog voltage in the signal retention circuit 112 can be controlled by setting the selection signal W to the L level.

To the respective signal retention circuits 112 are written analog voltages, which are based on the signals $S_{IN}$ at the time when the selection signals W are set to the H level at different timings, and the analog voltages are retained by setting the selection signals W to the L level. The plurality of signal retention circuits 112 can obtain the signals $S_{IN}$ at different timings and retain voltages corresponding to the signals $S_{IN}$. The plurality of signal retention circuits 112 consecutively sample the signals $S_{IN}$, whereby discrete values of the signals $S_{IN}$ output from the receiving circuit 13 can be retained.

The plurality of signal retention circuits 112 also have functions of amplifying and outputting the retained analog voltages. For example, each of the plurality of signal retention circuits 112 includes a source-follower circuit, and has a function of outputting a voltage corresponding to the retained analog voltage through the source-follower circuit or the like.

The selection circuit 113 (also referred to as a second selection circuit) has a function of a multiplexer, which selects one of the analog voltages retained in the plurality of signal retention circuits 112 and outputs it at a different timing. The selection circuit 113 has a function of a switch, and on/off is controlled by a selection signal S. The selection circuit 113 is composed of n-channel transistors, for example. In that case, the transistors included in the selection circuit 113 are on when the selection signal S is the H level and off when the selection signal S is the L level.

The selection circuit 113 can obtain a signal $S_{SEL}$. The signal $S_{SEL}$ is a signal corresponding to the signal $S_{IN}$, which is a discrete signal obtained by consecutively outputting the analog voltages retained in the plurality of signal retention circuits 112 included in the delay circuit 41. This signal $S_{SEL}$ corresponds to the signal $S_{IN}$ delayed by only a certain time. That is, the selection circuit 113 can output the signal $S_{SEL}$ with a certain delay time by setting the selection signal S to a predetermined delay time.

It is particularly preferable that each transistor included in the delay circuit 41 be a transistor including an oxide semiconductor in a channel formation region (hereinafter referred to as an OS transistor). With the use of an OS transistor as the transistors included in the delay circuit 41 in one embodiment of the present invention, thanks to its extremely low leakage current (hereinafter off-state current) which flows between a source and a drain when the transistor is off, analog voltages obtained by sampling signals $S_{IN}$ can be retained in the signal retention circuits 112 in the delay circuit 41. This enables highly accurate acquisition of analog voltages, whereby detection of an object and measurement of the distance to the object can be performed more precisely on the basis of the signal $S_{IN}$.

The signal retention circuit 112 using an OS transistor can rewrite and read out analog voltages by charging and discharging charges, thereby obtaining and reading out analog voltages substantially without limit. A signal retention circuit including an OS transistor is superior in rewrite endurance because, unlike a magnetic memory or a resistive random-access memory, it does not go through atomic-level structure change. In addition, unstableness due to the increase of electron trap centers is not observed in a signal retention circuit including an OS transistor even when rewrite operation is repeated like in a flash memory.

The signal retention circuit using an OS transistor can be freely arranged on a circuit using a transistor including silicon in a channel formation region (hereinafter a Si transistor); integration can be easily performed even when a plurality of delay circuits are provided. In addition, since an OS transistor can be fabricated using manufacturing equipment similar to that of an Si transistor, the fabrication is possible at low costs.

Moreover, an OS transistor can be a four-terminal semiconductor element including a back gate electrode in addition to a gate electrode, a source electrode, and a drain electrode. An electric network where input/output of signals flowing between a source and a drain can be independently controlled in accordance with a voltage applied to the gate electrode or the back gate electrode can be constituted. Thus, circuit design with the same ideas as those of an LSI is possible. In addition, an OS transistor has electric characteristics superior to those of an Si transistor in a high-temperature environment. Specifically, an OS transistor is capable of good switching operation at high temperatures higher than or equal to 125° C. and lower than or equal to 150° C., since its ratio between the on-state current and the off-state current ratio is high.

The signal processing circuit 42 has functions of calculating the difference between the signal $S_{SEL}$ selected by the selection circuit 113 and a reference signal, calculating integral values of the difference, and estimating the delay time at which phases are aligned. The signal processing circuit 42 includes, for example, a differential circuit, an integration circuit, a comparator, and a triangular wave generation circuit. The signal $S_{IN}$ selected by the selection circuit 113 and the reference signal are input to the differential circuit. The integration circuit outputs a value obtained by integrating output signals from the differential circuit. Output signals from the integration circuit and the triangular wave generation circuit are input to the comparator. The signal processing circuit 42 compares and processes signals of analog values, which can omit a large-area circuit such as an A/D conversion circuit, whereby an increase in the circuit area can be prevented and power consumption can be reduced.

Figure 1B:
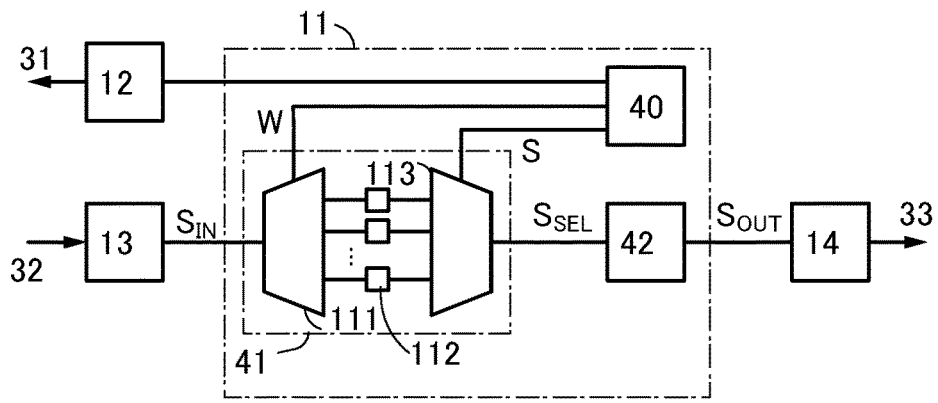

The driver alert system 100 illustrated in FIG. 1A includes OS transistors as transistors included in the delay circuit 41 illustrated in FIG. 1B, and employs the mode of directly retaining charges corresponding to analog voltages sampled at different timings. Since the OS transistors have an extremely low off-state current, the once retained analog voltages can be retained even in a small-capacity node; thus, a plurality of delay circuits can be provided. The driver alert system 100 illustrated in FIG. 1A employs the mode in which analog voltages corresponding to charges retained in the delay circuit 41 are read out at different timings so that discrete signals $S_{IN}$ are read out as output signals. With different timings of control signals S, reading out at a desired delay time is possible. The signals SN can be read out at a desired delay time without being converted into digital signals, so that phases of the discrete signals $S_{IN}$ can be delayed.

Figure 1C:
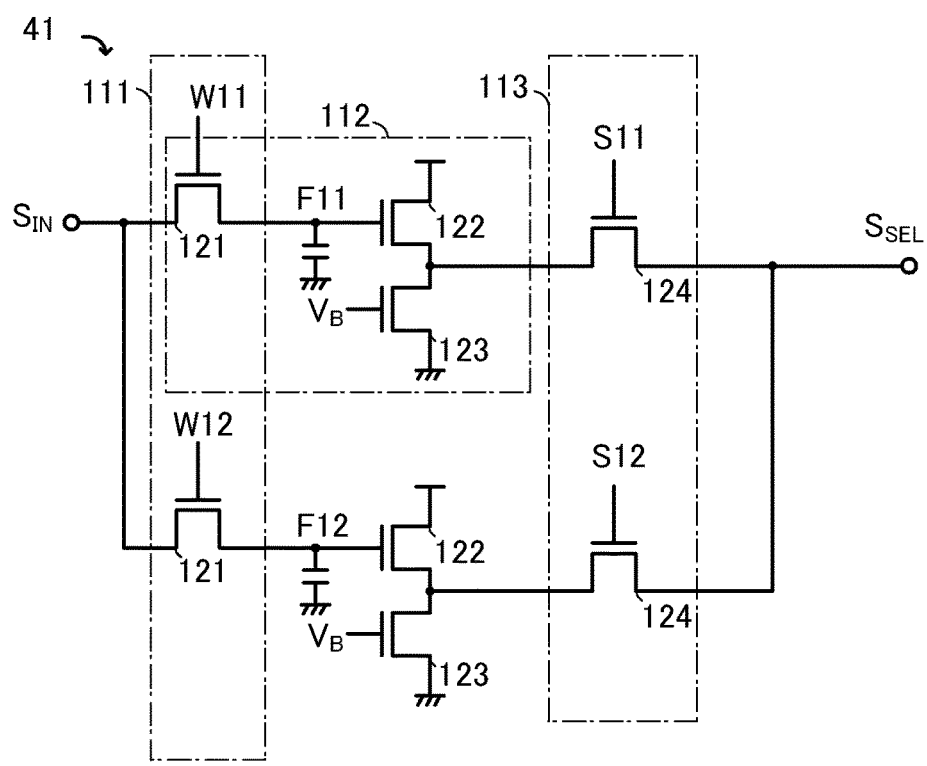

FIG. 1C illustrates a specific circuit configuration example of the delay circuit 41 illustrated in FIG. 1B. FIG. 1C illustrates a configuration example of a delay circuit which retains the signals $S_{IN}$ at two nodes and outputs them as the signals $S_{SEL}$ with different delay times.

FIG. 1C illustrates a transistor 121 which is included in the selection circuit 111, the transistor 121, a transistor 122, and a transistor 123 which are included in the signal retention circuit 112, and transistors 124 which are included in the selection circuit 113. The transistors 121 to 124 are n-channel transistors.

FIG. 1C illustrates selection signals W11 and W12 as the selection signals W. The selection signals W11 and W12 are signals for sampling analog voltages of the signals $S_{IN}$ at different timings.

FIG. 1C illustrates nodes F11 and F12, which are for retaining the analog voltages sampled by the selection circuit 111. In FIG. 1C, the nodes F11 and F12 are connected to the gates of the transistors 122 which are input terminals of the source-follower circuit. It is shown that bias voltages VB of the source-follower circuit are applied to the gates of the transistors 123. Note that although a structure in which capacitors are connected to the nodes F11 and F12 is illustrated, the capacitors can be omitted when the gate capacitance of the transistor 122 is sufficiently large.

FIG. 1C illustrates selection signals S11 and S12 as the selection signals S in the selection circuit 113. The selection circuit 113 selectively outputs voltages corresponding to the sampled analog voltages as the selection signals S11 and S12, whereby the selection circuit 113 can generate the signal $S_{SEL}$ corresponding to a signal obtained by delaying the signal $S_{IN}$ by a predetermined period. Note that the plurality of transistors 124 may be provided such that sources and drains are electrically parallel to each other. With such a structure, a plurality of signals having different delay times can be sequentially output.

Note that although FIG. 1A illustrates the configuration in which one receiving circuit and one transmission circuit are provided in the housing 10, a plurality of receiving circuits and a plurality of transmission circuits may be provided. For example, a configuration illustrated in FIG. 2A can be employed in which an transmission circuit 12A, an transmission circuit 12B, a receiving circuit 13A, and a receiving circuit 13B are provided and ultrasonic waves 31A and 31B are transmitted and ultrasonic waves 32A and 32B are received. The driver alert system can detect the object 30 by receiving different ultrasonic waves, so that the driver alert system can have higher safety. Note that the ultrasonic waves 32A and 32B are ultrasonic waves obtained through reflection of the ultrasonic waves 31A and 31B on the object 30.

Figure 2A:
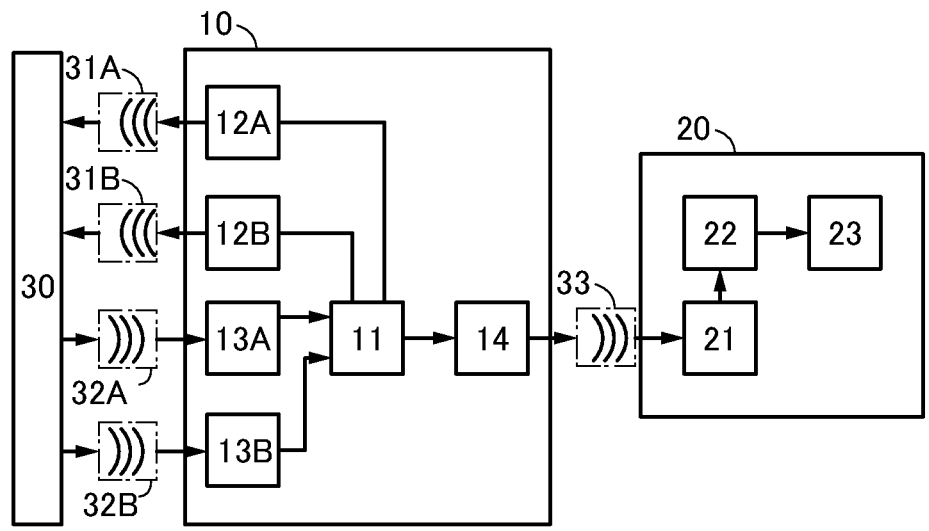
FIG. 2A and FIG. 2B each illustrate a structure of a driver alert system.
Figure 2B:
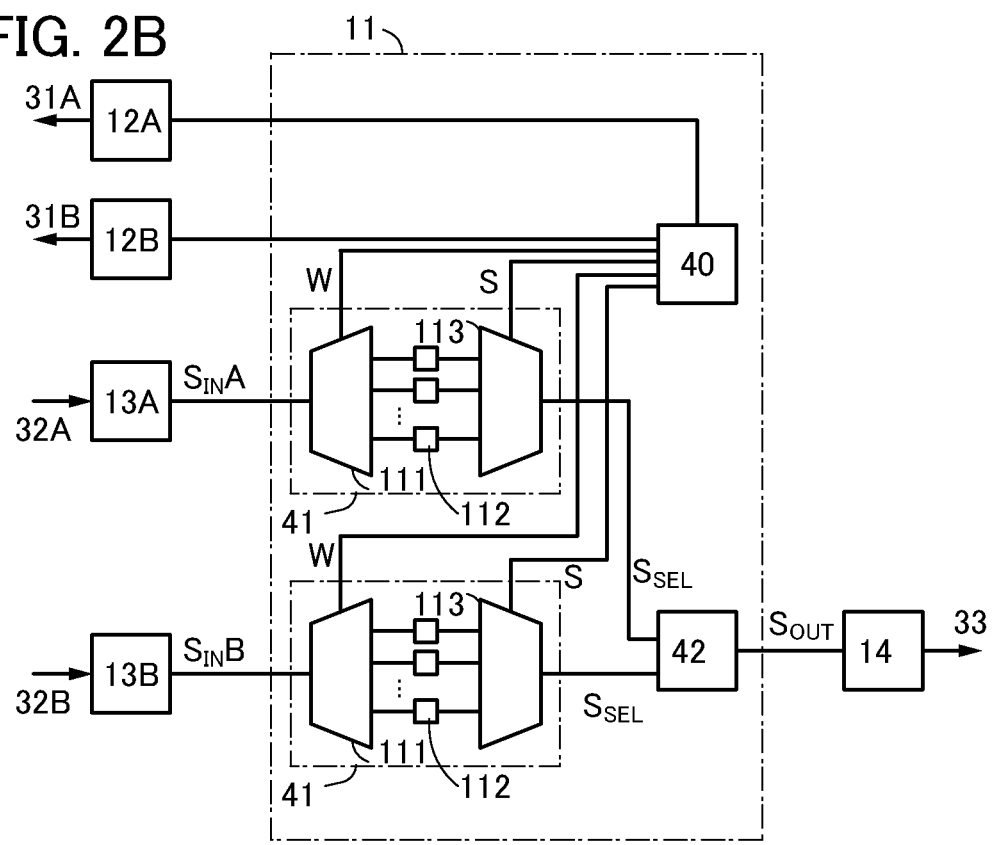

In the case of FIG. 1B, the delay circuit 41 is preferably provided for each of the receiving circuits 13A and 13B as illustrated in FIG. 2B. With this structure, a signal $S_{IN\_}A$ based on the ultrasonic wave 32A received by the receiving circuit 13A and a signal $S_{IN\_}B$ based on the ultrasonic wave 32B received by the receiving circuit 13B can be retained in different delay circuits 41.

Next, the operation of the delay circuit 41 illustrated in FIG. 1C is described with reference to FIG. 3 to FIG. 5.

Figure 3A:
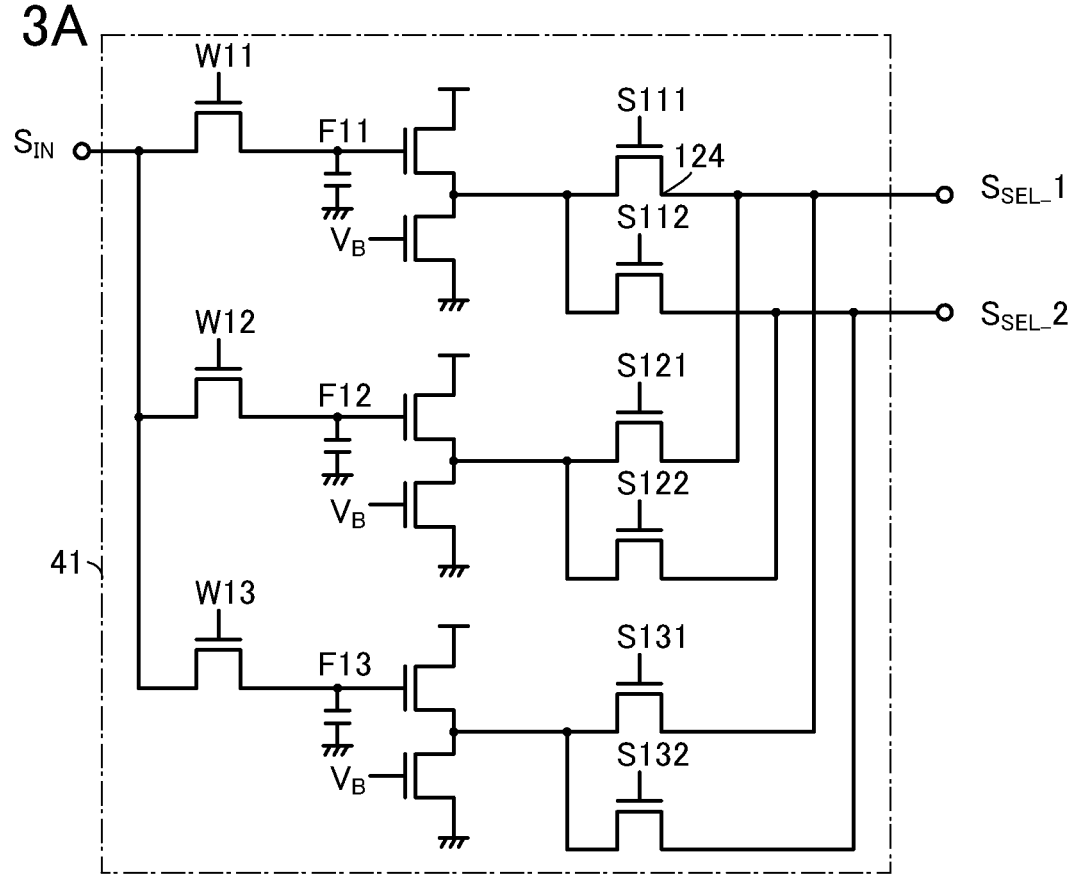
FIG. 3A and FIG. 3B each illustrate a structure of a driver alert system.

For easy understanding of the operation in FIG. 1C, in a configuration example of the delay circuit 41 in FIG. 3A, the selection signals W for sampling the signal $S_{IN}$ are selection signals W11 to W13, and the selection signals S for reading out a plurality of retained analog voltages as a signal $S_{SEL\_}1$ and a signal $S_{SEL\_}2$ are selection signals S111, S112, S121, S122, S131, and S132. In the configuration in FIG. 3A, the plurality of transistors 124 are provided such that sources and drains are electrically in parallel to each other. The signal $S_{SEL\_}1$ and the signal $S_{SEL\_}2$ are signals by making the signals $S_{IN}$ to have different phases. That is, the delay circuit 41 in FIG. 3A is configured to sample the signals $S_{IN}$ at three different timings to obtain three analog voltages and output two signals $S_{SEL\_}1$ and $S_{SEL\_}2$ with different delay times at two different timings. In FIG. 3A, nodes F11 to F13 are illustrated.

Figure 3B:
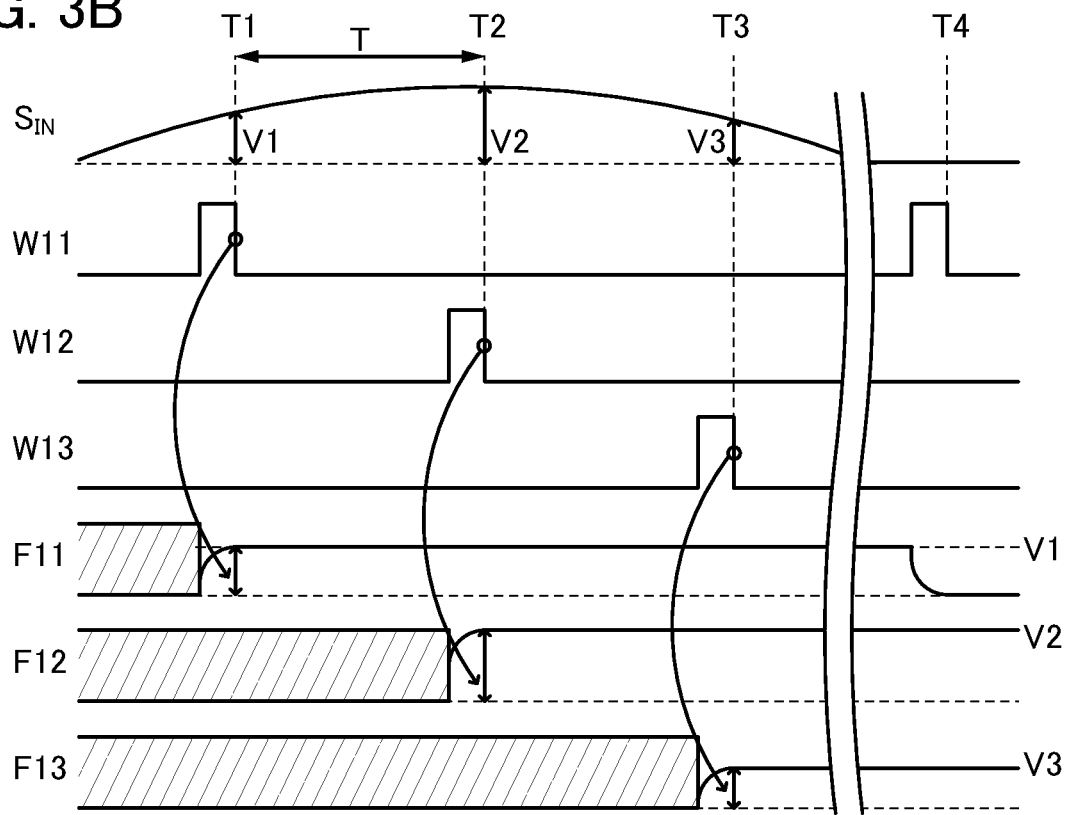

FIG. 3B is a timing chart showing operation of sampling the signal $S_{IN}$ which is connected to the delay circuit 41 in FIG. 3A. FIG. 3B shows, during times T1 to T4, a wave of the signal $S_{IN}$ and the operations of the selection signals W11 to W13 and voltages written to the nodes F11 to F13. In the diagram showing the timing chart, the periods with hatching are periods in an unstable state.

To sample the signal $S_{IN}$, the selection signal W11 is set to the H level at the time T1 and a voltage V1 of the signal $S_{IN}$ is written to the node F11, as described above.

At the time T2, which is a period T later from the T1, the selection signal W12 is set to the H level and a voltage V2 of the signal $S_{IN}$ is written to the node F12, whereby the signal $S_{IN}$ is sampled. The time T is preferably short. The number of samplings of the signals $S_{IN}$ can be increased, and an object can be easily detected.

At the time T2, the selection signal W13 is set to the H level and a voltage V3 of the signal $S_{IN}$ is written to the node F13, whereby the signal $S_{IN}$ is sampled.

The voltages V1 to V3 retained at the nodes F11 to F13 can be retained by setting the selection signals W11 to W13 to the L level. To initialize them, the selection signal W11 may be set to the H level in a state where the signal $S_{IN}$ at a constant potential is supplied as shown in the time T4.

Figure 4:
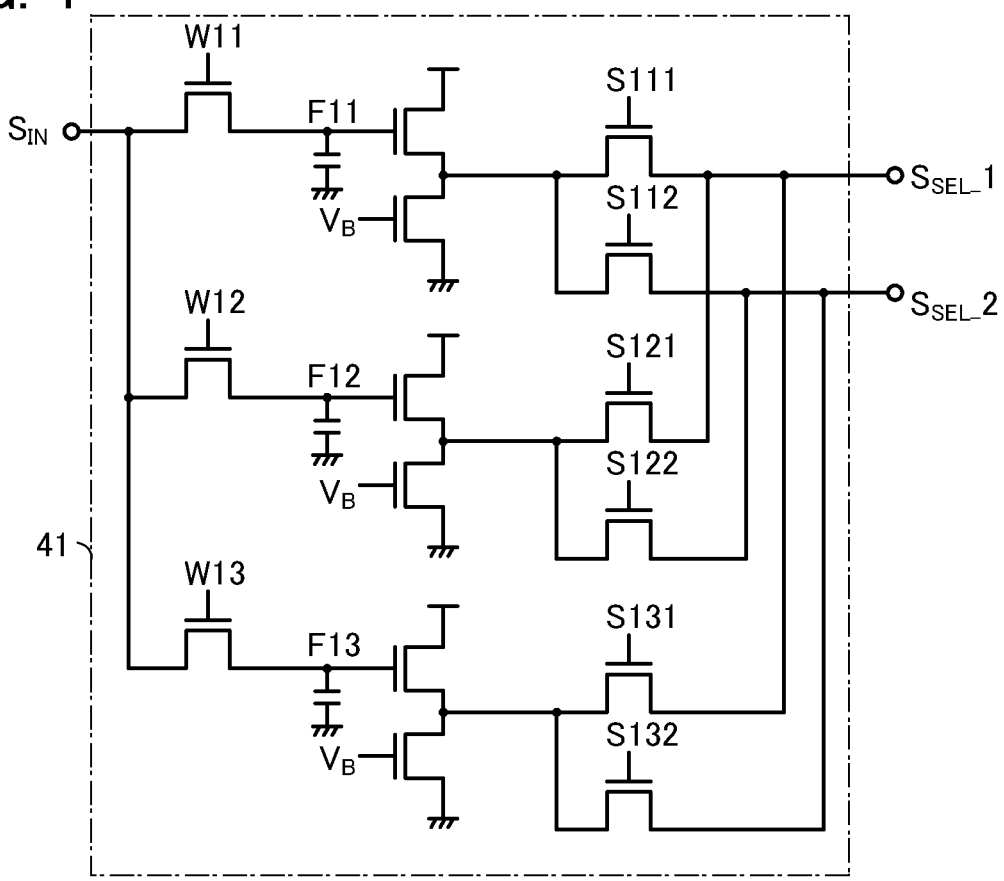
FIG. 4 illustrates a structure of a driver alert system.

For easy understanding of the operation in FIG. 1C, in a configuration example of the delay circuit 41 in FIG. 4, the selection signals W for sampling the signal $S_{IN}$ are selection signals W11 to W13, and the selection signals S for reading out retained voltages as a signal $S_{SEL\_}1$ and a signal $S_{SEL\_}2$ are selection signals S111, S112, S121, S122, S131, and S132. That is, the delay circuit 41 in FIG. 4 is configured to obtain three analog voltages and output two output signals with different delay times at two different timings. In FIG. 4, nodes F11 to F13 are illustrated.

Figure 5:
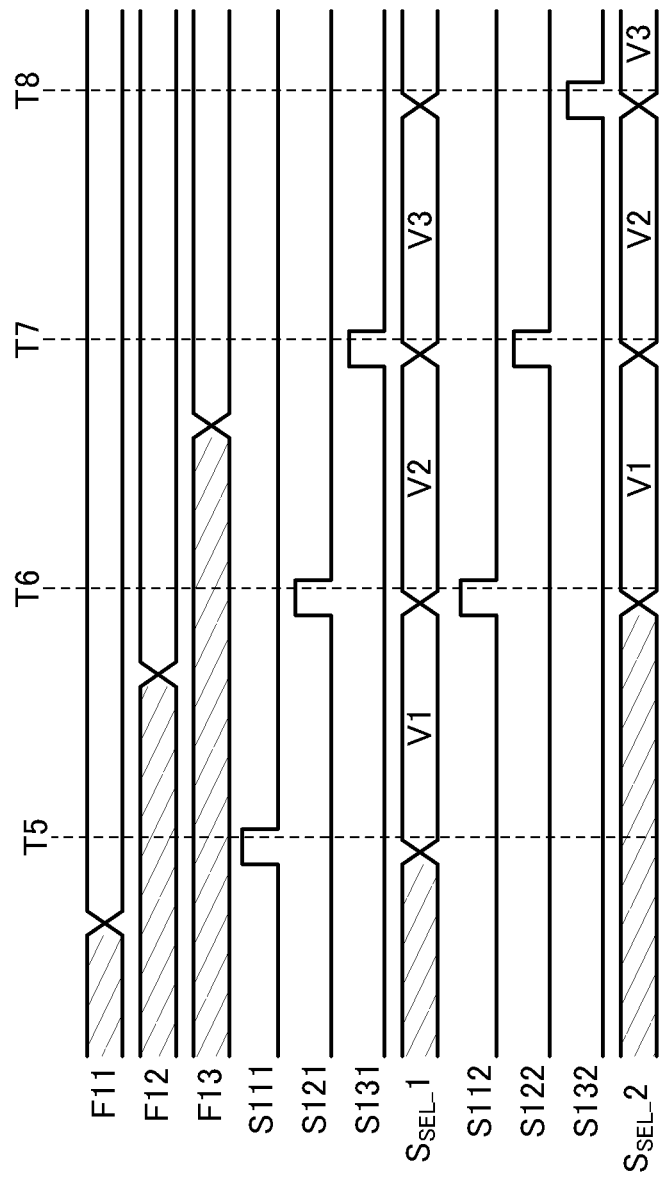
FIG. 5 shows a structure of a driver alert system.

FIG. 5 is a timing chart for describing operation of reading out the voltages V1 to V3 retained at the nodes F11 to F13 in the delay circuit 41 illustrated in FIG. 4 as the signal $S_{SEL\_}1$ and the signal $S_{SEL\_}2$. FIG. 5 shows operations from times T5 to T8 of the signal $S_{SEL\_}1$ and the signal $S_{SEL\_}2$ read out from the nodes F11 to F13 by the selection signals S111, S112, S121, S122, S131, and S132.

At the time T5, the selection signal S111 is set to the H level, and the voltage corresponding to the voltage V1 at the node F11 is output as the signal $S_{SEL\_}1$.

At the time T6, the selection signal S121 is set to the H level, and the voltage corresponding to the voltage V2 at the node F12 is output as the signal $S_{SEL\_}1$. At the same time T6, the selection signal S112 is set to the H level, and the voltage corresponding to the voltage V4 at the node F11 is output as the signal $S_{SEL\_}2$.

At the time T7, the selection signal S131 is set to the H level, and the voltage corresponding to the voltage V3 at the node F13 is output as the signal $S_{SEL\_}1$. At the same time T7, the selection signal S122 is set to the H level, and the voltage corresponding to the voltage V5 at the node F12 is output as the signal $S_{SEL\_}2$.

At the time T8, the selection signal S132 is set to the H level, and the voltage corresponding to the voltage V3 at the node F13 is output as the signal $S_{SEL\_}2$.

As shown in FIG. 5, the signal $S_{SEL\_}2$ can be obtained as a signal obtained by delaying the signal $S_{SEL\_}1$. By controlling the timing of the selection signal S, the signals retained in the signal retention circuits can be output with any delay time. Thus, for example, phases of different signals can be aligned by changing the delay time in the delay circuit 41, whereby the object can be detected.

Figure 6:
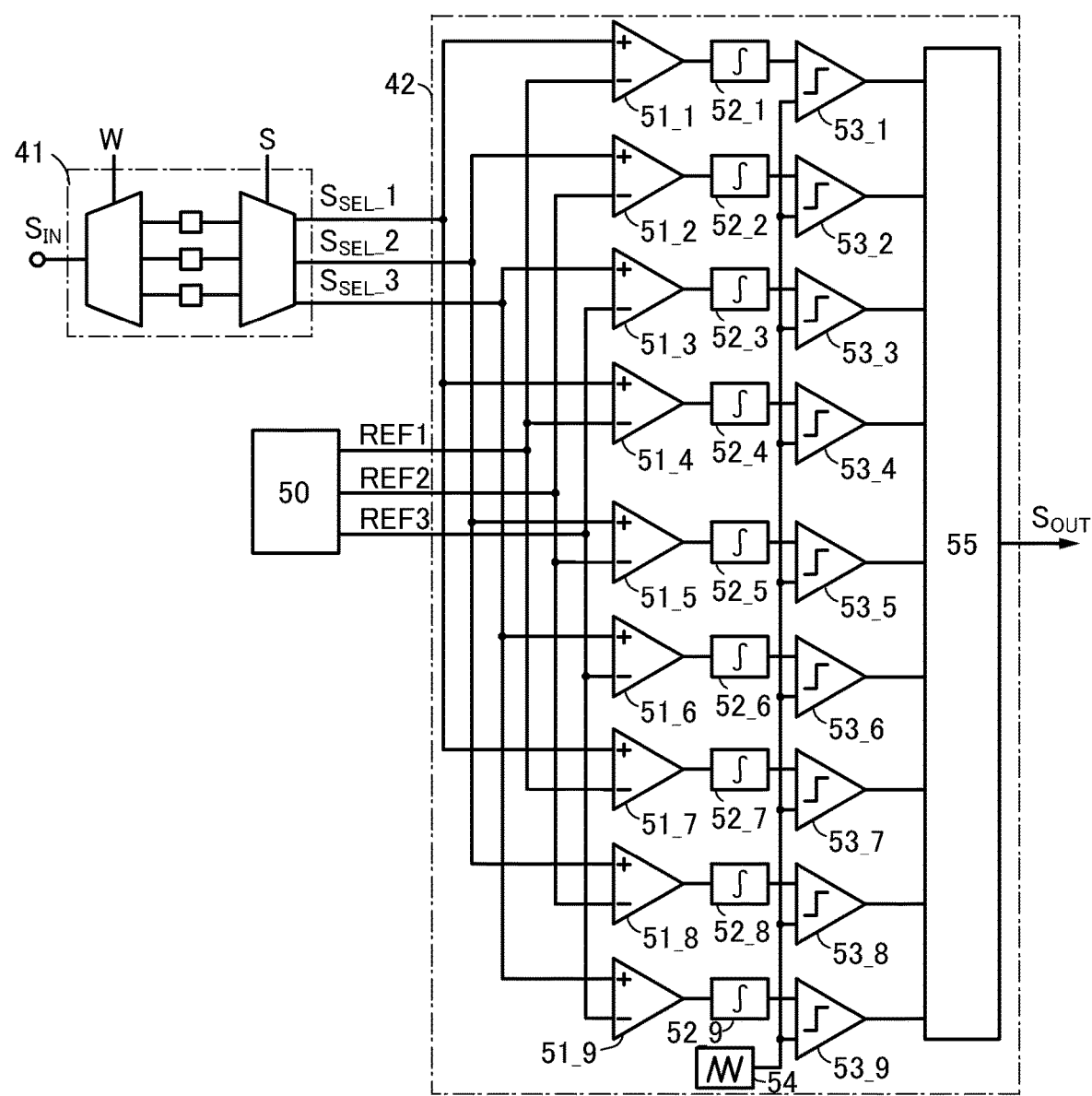
FIG. 6 illustrates a structure of a driver alert system.

Next, FIG. 6 illustrates a specific configuration example of the signal processing circuit 42. The signal processing circuit 42 in FIG. 6 includes differential circuits 51_1 to 51_9, integration circuits 52_1 to 52_9, comparators 53_1 to 53_9, a triangular wave generation circuit 54, and an arithmetic circuit 55. FIG. 6 also illustrates a reference signal generation circuit 50 that outputs reference signals REF1 to REF3. The reference signals REF1 to REF3 are compared with a signal obtained by reflection of an ultrasonic wave on an object in order to detect the position of the object. For example, as the reference signals REF1 to REF3, a signal synchronized with the ultrasonic wave 31 output from the transmission circuit 12 can be used.

The differential circuits 51_1 to 51_9 calculate differences between the signal $S_{SEL}$ output from the delay circuit 41 and the reference signal REF output from the reference signal generation circuit 50. The integration circuits 52_1 to 52_9 receive output signals from the differential circuits 51_1 to 51_9, respectively, and integrate the output signals. The comparators 53_1 to 53_9 receive triangular waves from the triangular wave generation circuit 54 and output signals from the integration circuits 52_1 to 52_9, and compare voltages. The arithmetic circuit 55 receives the output signals from the comparators 53_1 to 53_9 and estimates delay time to align the phases between the signal $S_{IN}$ and the reference signal REF, whereby a signal Sour, which corresponds to the distance to the object, can be obtained.

Figure 7A:
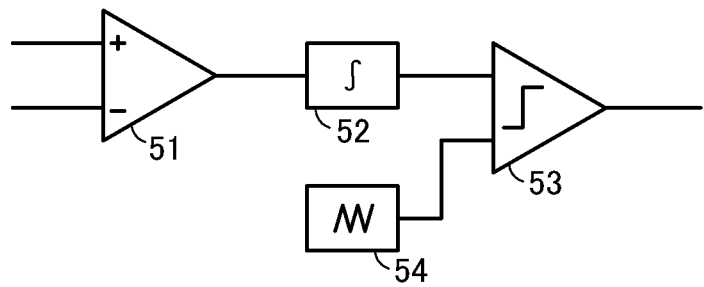
FIG. 7A, FIG. 7B, and FIG. 7C each illustrate a structure of a driver alert system.

Specific examples of the circuit included in the signal processing circuit 42 are described with reference to FIG. 7A to FIG. 7C. FIG. 7A is a block diagram showing a structure of one stage in the signal processing circuit 42 in FIG. 6. FIG. 7A illustrates a differential circuit 51, an integration circuit 52, a comparator 53, and a triangular wave generator circuit 54 as an example.

Figure 7B:
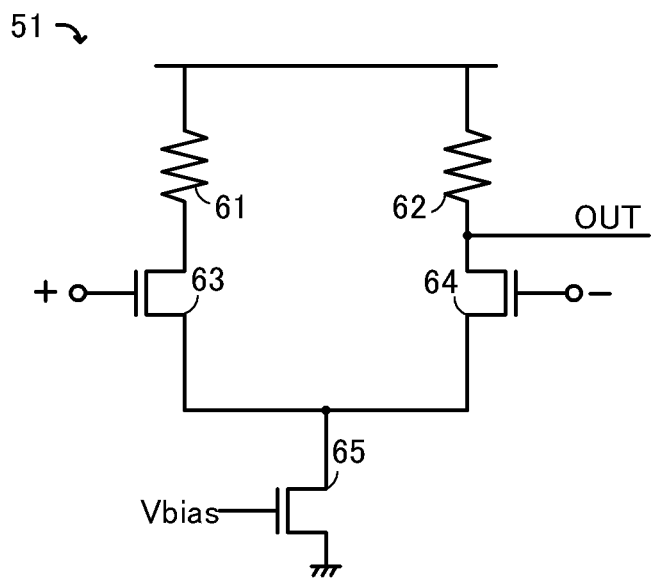

A configuration example of the differential circuit 51 is illustrated in FIG. 7B. The differential circuit 51 includes resistors 61 and 62 and transistors 63, 64, and 65, for example. A non-inverting input terminal is connected to a gate of the transistor 63. An inverting input terminal is connected to a gate of the transistor 64. A wiring which provides a bias voltage Vbias is connected to a gate of the transistor 65. An output terminal OUT of the differential circuit 51 is provided on the drain terminal side of the transistor 64.

Figure 7C:
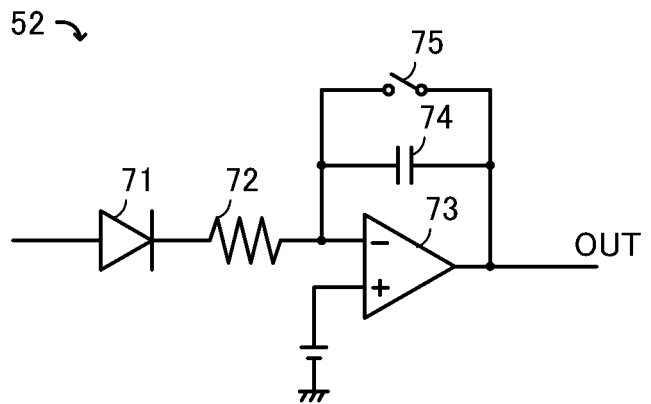

A configuration example of the integration circuit 52 is illustrated in FIG. 7C. The integration circuit 52 includes a diode 71, a resistor 72, an operational amplifier 73, a capacitor 74, and a switch 75, for example. An output signal of the differential circuit 51 is supplied to the input terminal of the diode 71. An output terminal OUT of the integration circuit 52 is provided on the output terminal of the operational amplifier.

Figure 8A:
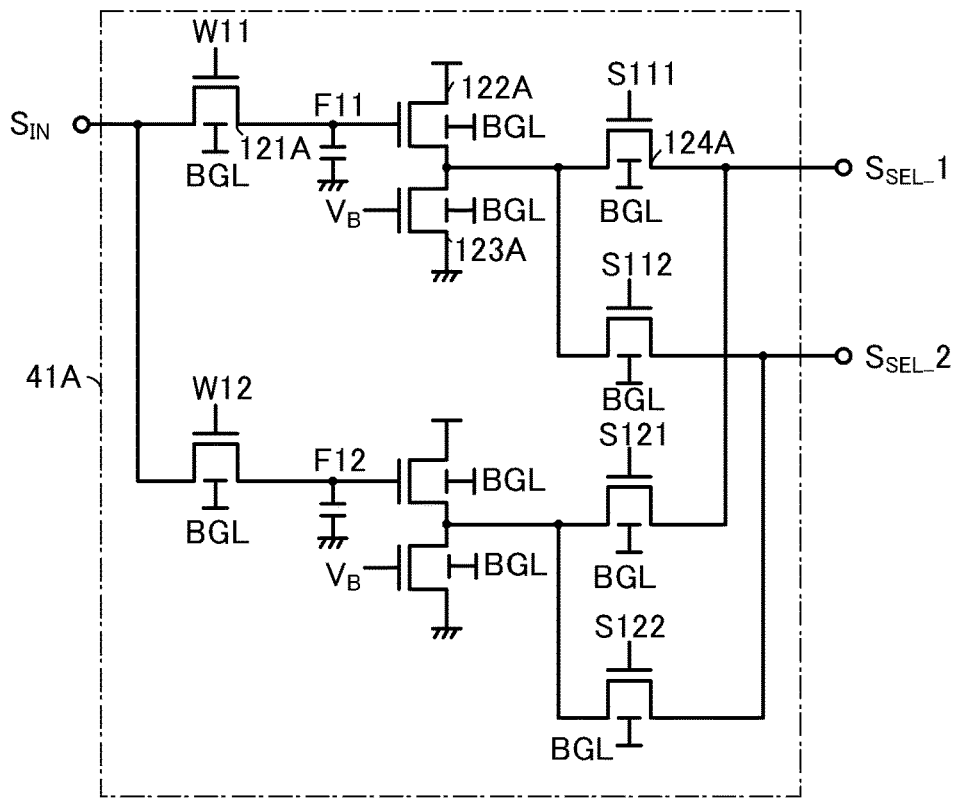
FIG. 8A and FIG. 8B each illustrate a structure of a driver alert system.
Figure 8B:
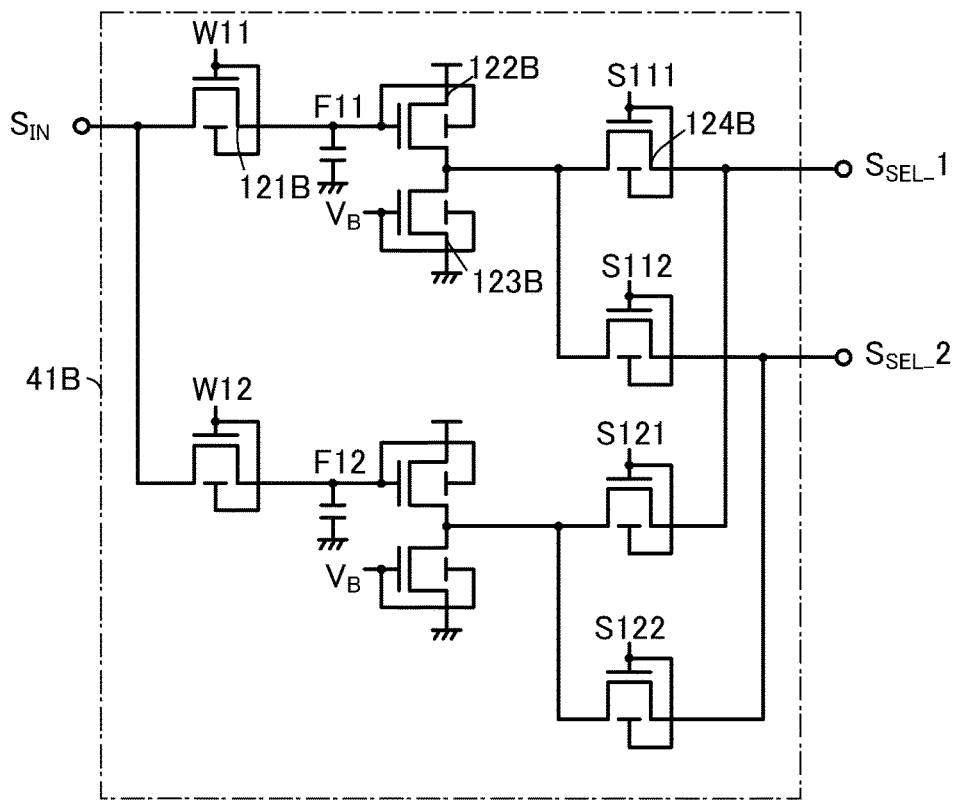

FIG. 8A and FIG. 8B illustrate modification examples of the above-described delay circuit 41.

The transistors 121 to 124 in FIG. 1C, FIG. 3A, and the like are illustrated to have a top-gate structure or a bottom-gate structure without a back gate electrode; however they are not limited thereto. For example, transistors 121A to 124A, which have a back gate electrode, may be employed like in a delay circuit 41A in FIG. 8A. The structure in FIG. 8A improves controllability of the transistors 121A to 124A from the outside.

For example, transistors 121B to 124B, which have a back gate electrode connected to a gate electrode, may be employed like in a delay circuit 41B in FIG. 8B. The structure in FIG. 8B can increase the amount of current flowing through the transistors 121B to 124B.

Figure 9A:
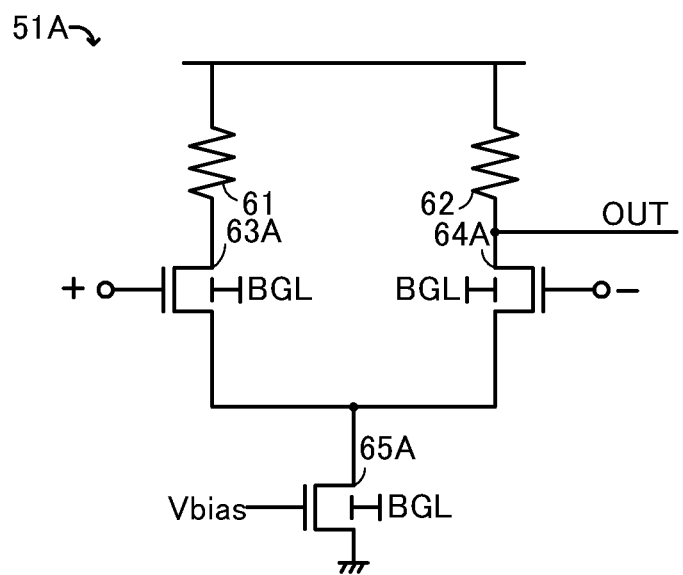
FIG. 9A and FIG. 9B each illustrate a structure of a driver alert system.
Figure 9B:
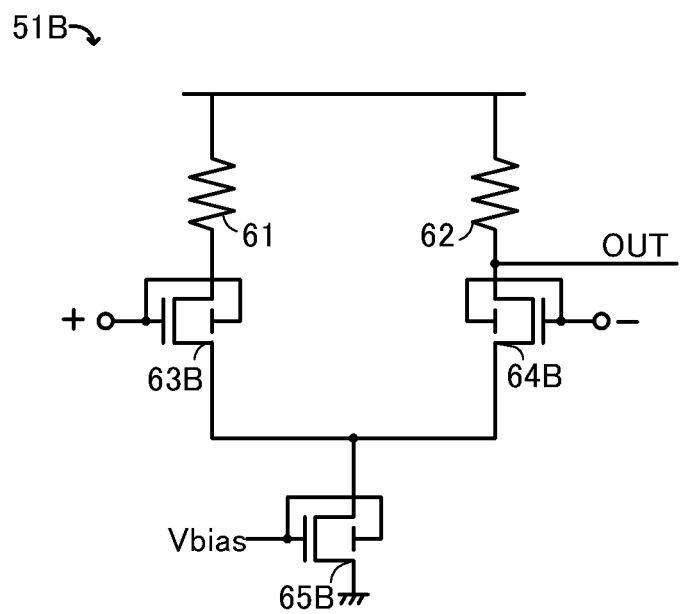

FIG. 9A and FIG. 9B illustrate modification examples of the above-described differential circuit 51.

The transistors 63 to 65 in FIG. 7B are illustrated to have a top-gate structure or a bottom-gate structure without a back gate electrode; however they are not limited thereto. For example, transistors 63A to 65A, which have a back gate electrode, may be employed like in a differential circuit 51A in FIG. 9A. The structure in FIG. 9A improves controllability of the transistors 63A to 65A from the outside.

For example, transistors 63B to 65B, which have a back gate electrode connected to a gate electrode, may be employed like in a differential circuit 51B in FIG. 9B. The structure in FIG. 9B can increase the amount of current flowing through the transistors 63B to 65B.

The above-described driver alert system of one embodiment of the present invention is configured to retain an analog voltage using an arithmetic circuit including an OS transistor, and thus does not need a circuit for delaying a signal, such as an analog-digital conversion circuit. In addition to reductions in size and power consumption, the driver alert system of one embodiment of the present invention can achieve improvement in safety because it can be mounted on an electronic device that a driver can wear.

Embodiment 2

In this embodiment, a structure of a transistor applicable to the circuit configuration of a delay circuit or the like described in the above embodiment, specifically, a schematic cross-sectional structure in which transistors having different electrical characteristics are stacked will be described. With the structure, the degree of flexibility in design of the circuit can be increased. Furthermore, when transistors having different electrical characteristics are stacked, the integration degree of the circuit can be increased.

Figure 10:
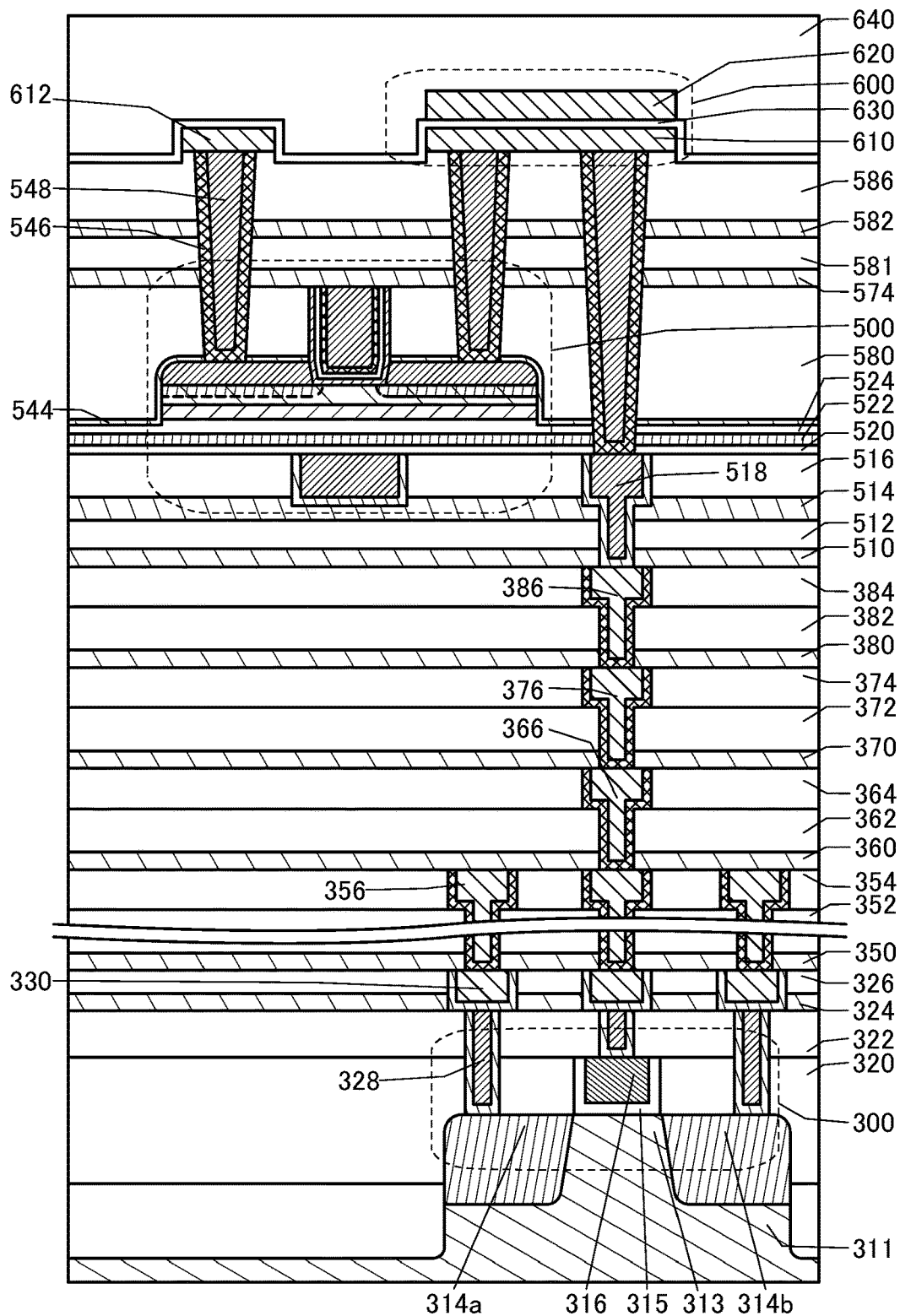
FIG. 10 is a schematic cross-sectional diagram illustrating a structure example of a transistor.
Figure 12A:
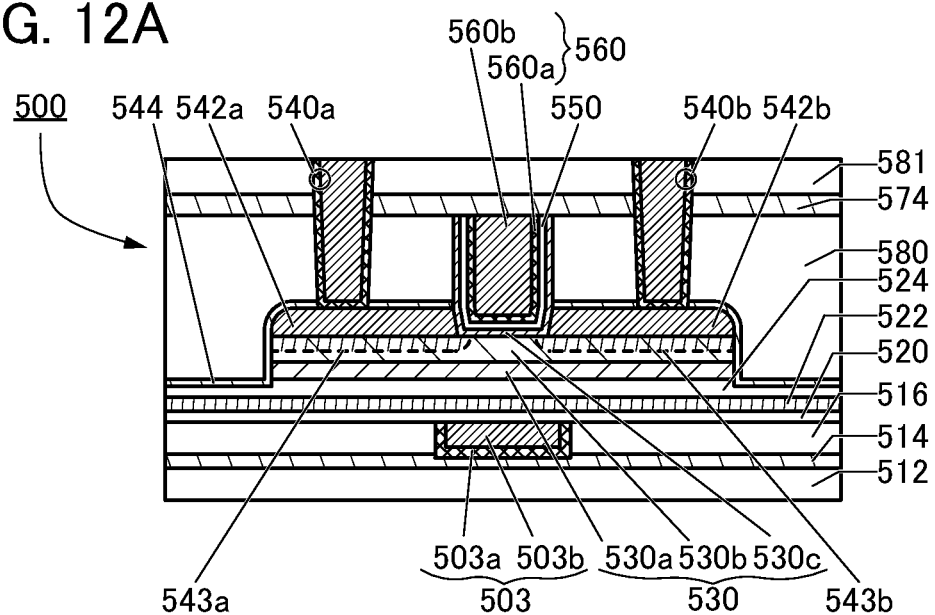
FIG. 12A, FIG. 12B, and FIG. 12C are top and cross-sectional diagrams illustrating a structure example of a transistor.
Figure 12B:
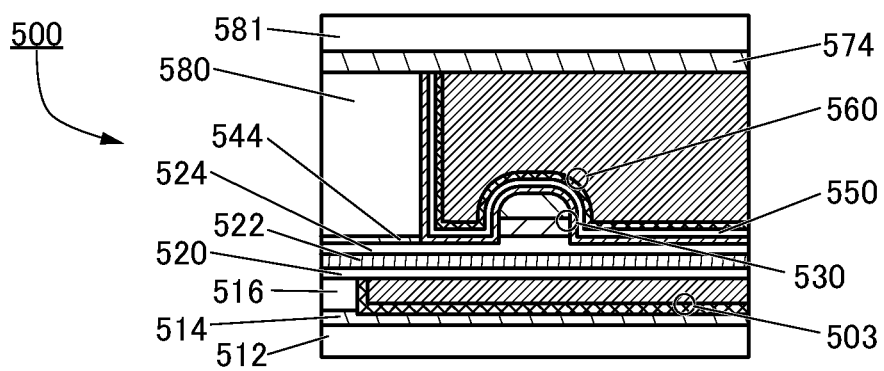
Figure 12C:
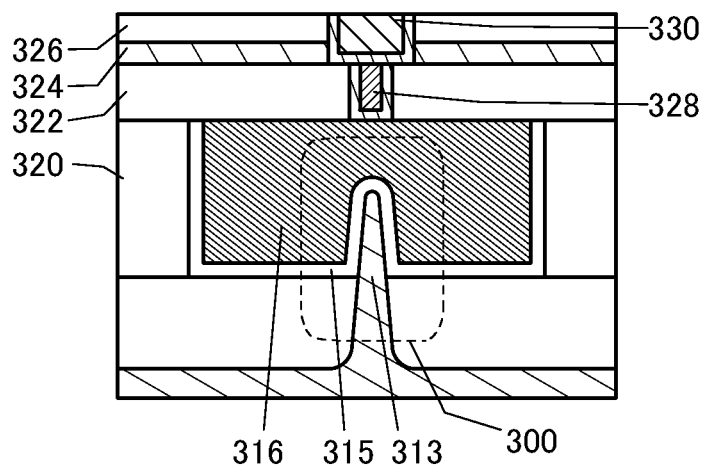

The schematic cross-sectional diagram in FIG. 10 includes a transistor 300, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 300 in the channel width direction.

The transistor 500 is a transistor including a metal oxide in a channel formation region (an OS transistor). The transistor 500 has a low off-state current, and thus can retain data voltage or charges written for a long time.

The schematic cross-sectional diagram described in this embodiment illustrates the transistor 300, the transistor 500, and the capacitor 600, as illustrated in FIG. 10. The transistor 500 is provided above the transistor 300, and the capacitor 600 is provided above the transistor 300 and the transistor 500. Note that the capacitor 600 can be a capacitor Cs in a memory circuit MC, for example.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

In the transistor 300, the top surface and the side surface in the channel width direction of the semiconductor region 313 are covered with the conductor 316 with the insulator 315 therebetween, as illustrated in FIG. 12C. Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 11:
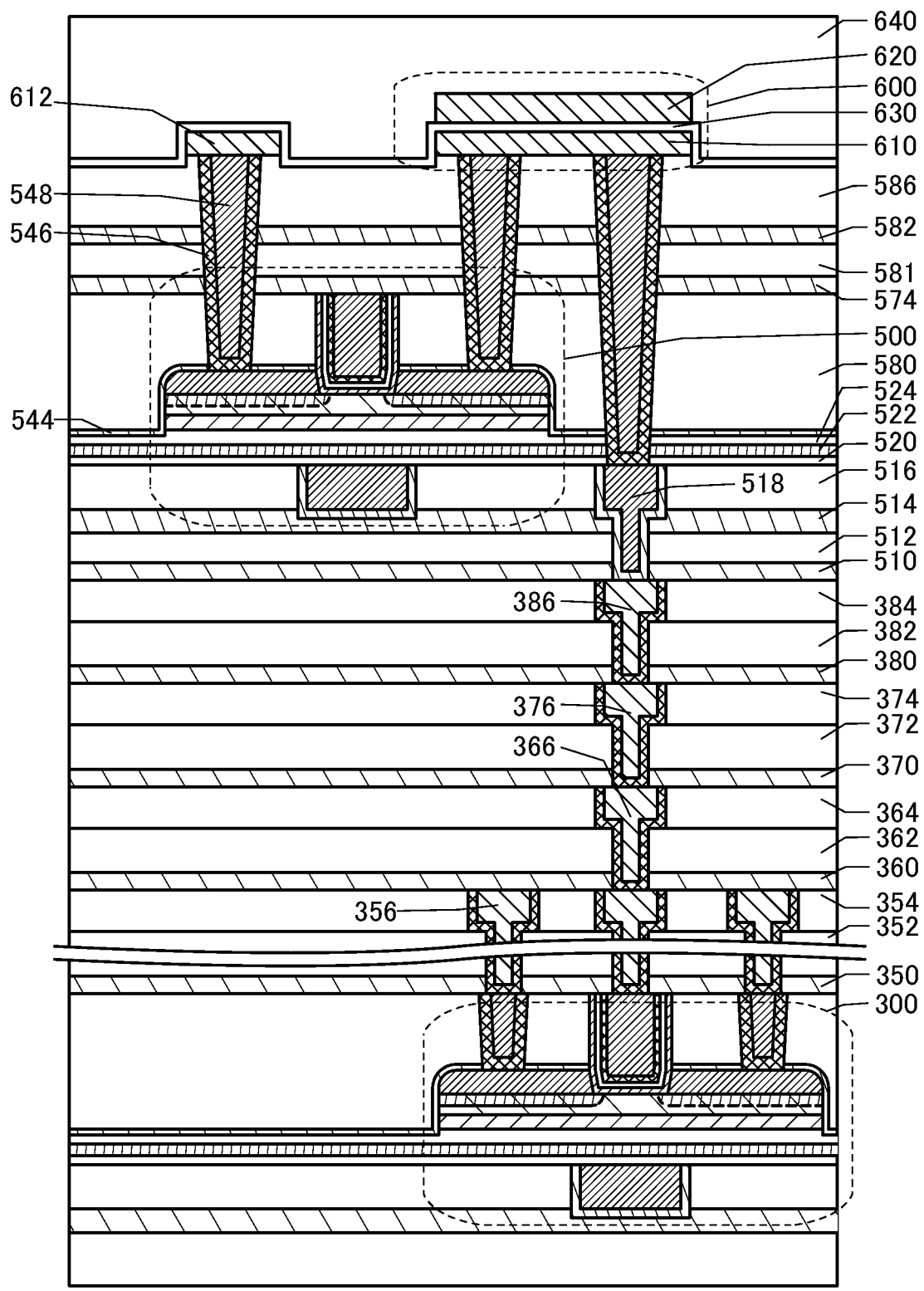
FIG. 11 is a schematic cross-sectional diagram illustrating a structure example of a transistor.

Note that the transistor 300 illustrated in FIG. 10 is an example and the structure is not limited thereto; an appropriate transistor can be used in accordance with a circuit structure or a driving method. For example, in the case of a single-polarity circuit using only OS transistors (which represents a circuit formed with transistors having the same polarity, e.g., only n-channel transistors), the transistor 300 has a structure similar to that of the transistor 500 using an oxide semiconductor, as illustrated in FIG. 11. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 300, or the like to a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material having a low dielectric constant is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 10, an insulator 350, an insulator 352, and an insulator 354 are stacked in this order. A conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With the structure, the transistor 300 and the transistor 500 can be separated by the barrier layer, so that the diffusion of hydrogen from the transistor 300 to the transistor 500 can be inhibited.

Note that for the conductor having a barrier property against hydrogen, tantalum nitride is preferably used, for example. Stacking tantalum nitride and tungsten having high conductivity can inhibit the diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 10, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 10, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 10, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With the structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the schematic cross-sectional structure of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like to the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With the structure, the transistor 300 and the transistor 500 can be separated by the layer having a barrier property against oxygen, hydrogen, and water; thus, diffusion of hydrogen from the transistor 300 to the transistor 500 can be inhibited.

The transistor 500 is provided above the insulator 516.

As illustrated in FIG. 12A and FIG. 12B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 12A and FIG. 12B, an insulator 544 is preferably provided between the insulator 580 and the oxide 530a, the oxide 530b, the conductor 542a, and the conductor 542b. In addition, as illustrated in FIG. 12A and FIG. 12B, the conductor 560 preferably includes a conductor 560a provided inside the insulator 550 and a conductor 560b embedded inside the conductor 560a. As illustrated in FIG. 12A and FIG. 12B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 10 and FIG. 12A is an example, and the structure is not limited thereto; an appropriate transistor can be used in accordance with a circuit structure or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the transistor can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 505 is not necessarily provided. Note that the conductor 503b is shown as a single layer but may have a stacked-layer structure, for example, a stack of the above conductive material and titanium or titanium nitride.

The insulator 520, the insulator 522, the insulator 524, and the insulator 550 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

In the case where the insulator 524 includes an excess-oxygen region, it is preferable that the insulator 522 have a function of inhibiting diffusion of oxygen (e.g., an oxygen atom, an oxygen molecule, or the like) (the oxygen is less likely to pass).

The insulator 522 preferably has a function of inhibiting diffusion of oxygen or impurities, in which case diffusion of oxygen contained in the oxide 530 to the insulator 520 side is prevented. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SRTiO$_3$), or (Ba,SR)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 to the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator which is a high-k material is combined with silicon oxide or silicon oxynitride, the insulator 520 having a stacked-layer structure that has thermal stability and a high dielectric constant and an insulator 526 can be obtained.

Note that in the transistor 500 in FIG. 12A and FIG. 12B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS. Furthermore, as the oxide 530, an In—Ga oxide or an In—Zn oxide may be used.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics in some cases. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing much hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^3$. Note that the lower limit of the carrier concentration of the metal oxide in the channel formation region is not particularly limited and can be, for example, $1\times10^{-9}$ cm$^{-3}$.

When a metal oxide is used as the oxide 530, contact between a conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 to the conductor 542 can be interpreted as absorption of oxygen in the oxide 530 by the conductor 542.

When oxygen in the oxide 530 diffuses to the conductor 542 (the conductor 542a and the conductor 542b), another layer is sometimes formed between the conductor 542a and the oxide 530b, and between the conductor 542b and the oxide 530b. The layer contains more oxygen than the conductor 542 does and thus the layer presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure that mainly has a MIS structure.

The above layer is not necessarily formed between the conductor 542 and the oxide 530b, but the layer may be formed between the conductor 542 and the oxide 530c or formed between the conductor 542 and the oxide 530b and between the conductor 542 and the oxide 530c.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

By including the oxide 530a under the oxide 530b, the oxide 530 can inhibit diffusion of impurities to the oxide 530b from the components formed below the oxide 530a. By including the oxide 530c over the oxide 530b, the oxide 530 can inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably greater than the atomic ratio of the element M to the constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 12, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 12A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. The channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than hafnium oxide. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 to the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 functioning as the first gate electrode has a two-layer structure in FIG. 12A and FIG. 12B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the oxide semiconductor can have a reduced electrical resistance value to be a conductor. This can be called an OC (Oxide Conductor) electrode.

In addition, a conductive material containing tungsten, copper, or aluminum as its main component is preferably used for the conductor 560b. The conductor 560b also functions as a wiring and thus is preferably formed using a conductor having high conductivity. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably reduced.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the transistor, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low dielectric constant is used for the insulator 586, parasitic capacitance generated between wirings can be reduced. For example, a silicon oxide film, a silicon oxynitride film, or the like can be used for the insulator 586.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

In addition, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are illustrated in FIG. 10, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a transistor including an oxide semiconductor can be miniaturized or highly integrated.

Embodiment 3

In this embodiment, as examples of devices (semiconductor devices) to which the driver alert system can be applied, an electronic component and a wearable device to which the electronic component can be applied, and the like will be described.

<Example of Method for Manufacturing Electronic Component>

Figure 13A:
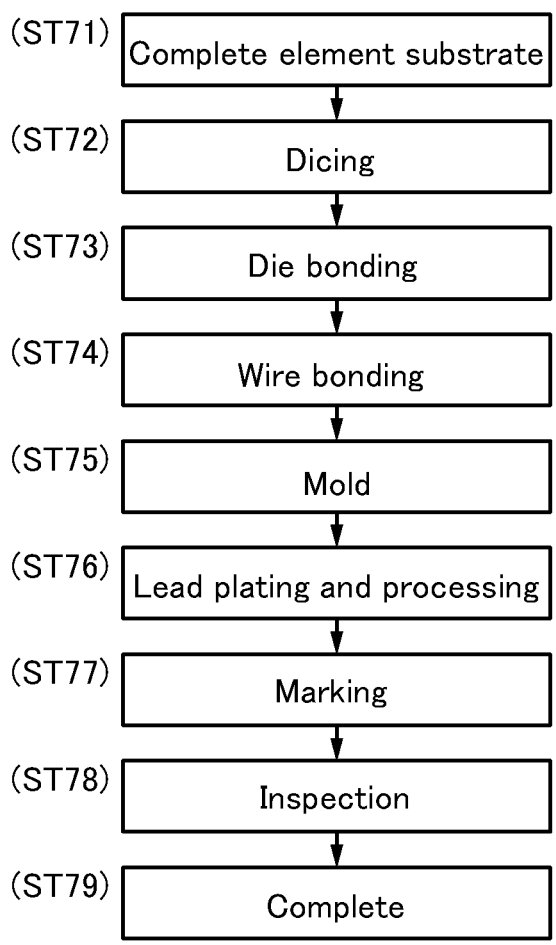
FIG. 13A, FIG. 13B, FIG. 13C, FIG. 13D, and FIG. 13E illustrate a structure of a semiconductor wafer and an electronic component.

FIG. 13A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment. Electronic components described below can be used as an electronic component of the housing 10 or the housing 20 in Embodiment 1.

A semiconductor device including a transistor is completed by integrating detachable components on a printed wiring board through an assembly process (post-process). The post-process can be finished through steps in FIG. 13A. Specifically, after an element substrate obtained in the preceding process is completed (step ST71), a rear surface of the substrate is ground. The substrate is thinned in this step to reduce warpage or the like of the substrate in the preceding process and to reduce the size of the electronic component. Next, the substrate is divided into a plurality of chips in a dicing step (step ST72).

Figure 13B:
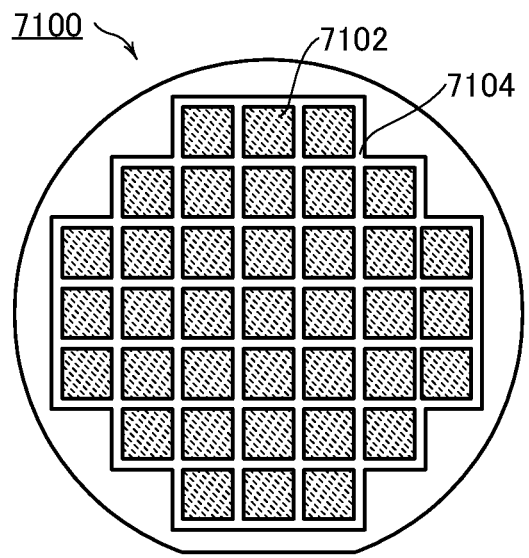
Figure 13C:
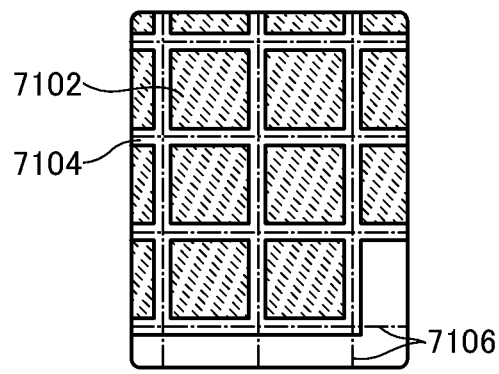

FIG. 13B is a top view of a semiconductor wafer 7100 before the dicing step. FIG. 13C is a partial enlarged view of FIG. 13B. A plurality of circuit regions 7102 are provided over the semiconductor wafer 7100. The circuit in one embodiment of the present invention is provided in the circuit region 7102.

Figure 13D:
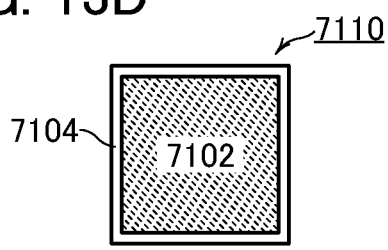

The plurality of circuit regions 7102 are each surrounded by a separation region 7104. Separation lines (also referred to as dicing lines) 7106 are set at a position overlapping with the separation regions 7104. The semiconductor wafer 7100 is cut along the separation lines 7106 into chips 7110 including the circuit regions 7102 in the dicing step (step ST72). FIG. 13D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, which prevents a decrease in yield caused by the dicing step. A dicing step is generally performed while supplying pure water whose specific resistance is decreased by dissolution of a carbonic acid gas or the like to a cut portion, in order to cool down a substrate, remove swarf, and prevent electrification, for example. Providing a conductive layer or a semiconductor layer in the separation regions 7104 allows a reduction in the usage of pure water.

After Step ST72, the divided chips are separately picked up to be mounted on and bonded to a lead frame in a die bonding step (step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (step ST74). A silver line or a gold line can be used as the metal fine line. Either ball bonding or wedge bonding may be used as wire bonding.

A molding step is performed to seal the wire bonded chip with an epoxy resin or the like (step ST75). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (step ST76). This plating step prevents rust of the lead and ensures soldering at the time of mounting the chip on a printed wiring board in a later step. Printing (marking) is performed on a surface of the package (step ST77). Through an inspection step (step ST78), the electronic component is completed (step ST79).

Figure 13E:
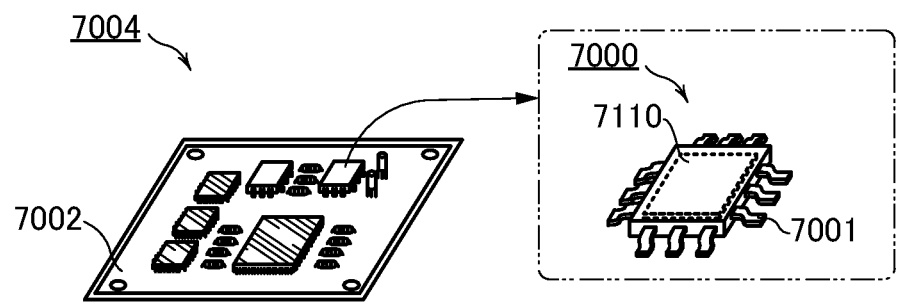

FIG. 13E is a schematic perspective view of the completed electronic component. FIG. 13E illustrates a schematic perspective view of a quad flat package (QFP) as an example of the electronic component. As illustrated in FIG. 13E, an electronic component 7000 includes a lead 7001 and a chip 7110.

The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

The electronic component 7000 can be applied to watch-type, head-mounted, goggle-type, glasses-type, armband-type, bracelet-type, and necklace-type wearable electronic devices.

<Application Examples to Electronic Device>

Next, the case where the above-described electronic component is used for a wearable electronic device or a housing is described.

Figure 14A:
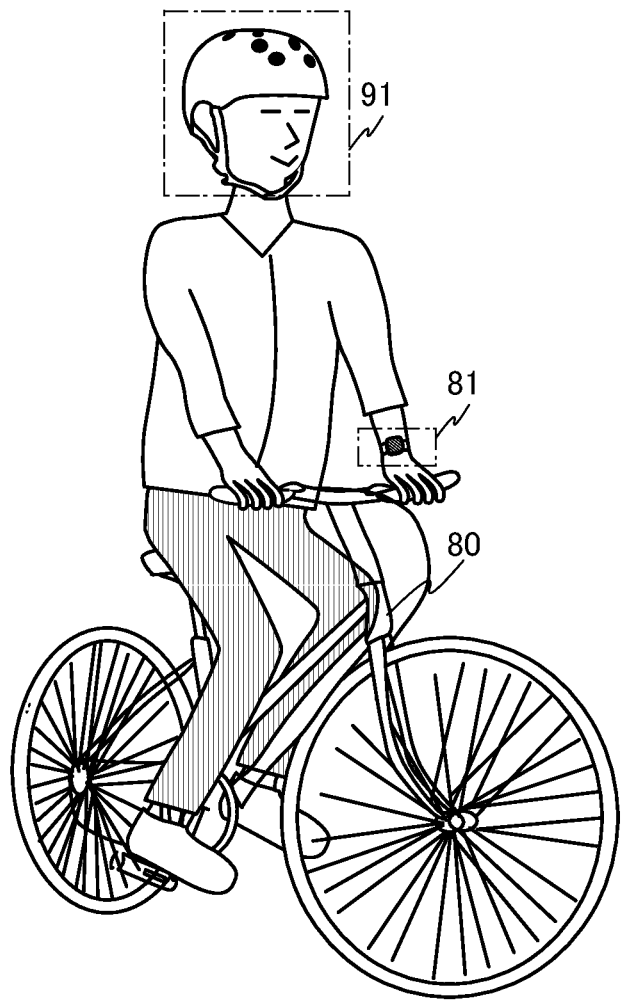
FIG. 14A, FIG. 14B, and FIG. 14C illustrate structure examples of electronic devices.

FIG. 14A is a schematic diagram illustrating a bicyclist. A frame 80 of a bicycle corresponds to the housing 10 described in Embodiment 1. In the case of a bicycle, the housing 10 is also applicable to parts such as handlebars. Although omitted in the drawing, an electronic component including the receiving circuit, the transmitting circuit, the arithmetic circuit, or the like described in Embodiment 1 can be provided on the frame 80.

Figure 14B:
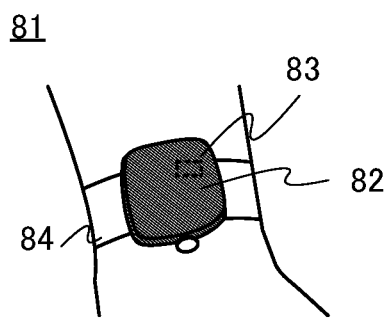

In FIG. 14A, a watch-type electronic terminal 81 and a helmet 91 are illustrated as wearable devices which corresponds to the housing 20 described in Embodiment 1. FIG. 14B is an enlarged view of the watch-type electronic terminal 81 and FIG. 14C is an enlarged view of the helmet 91.

A housing of the watch-type electronic terminal 81 illustrated in FIG. 14B is provided with a display portion 82 and an electronic component 83 which includes the receiving circuit 21, the control circuit 22, the vibration motor 23, and the like described in Embodiment 1. The electronic component 83 can alert the bicyclist the existence of an object by vibrating the display portion 82 or the belt 84 with use of a vibration motor or the like in accordance with an ultrasonic wave emitted by the frame 80 which is a main body of the bicycle. Thus, the bicyclist can recognize the existence of an object easily, which can obviate danger.

Figure 14C:
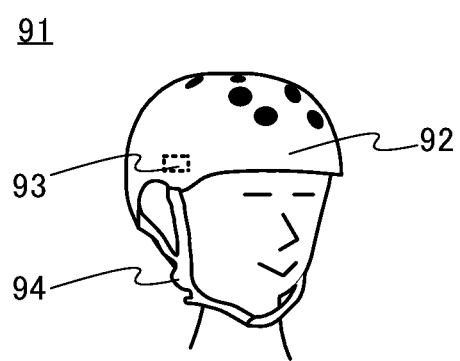

A protection portion 92 of the helmet 91 illustrated in FIG. 14C is provided with an electronic component 93 that includes the receiving circuit 21, the control circuit 22, the vibration motor 23, and the like described in Embodiment 1. The electronic component 93 can alert the bicyclist the existence of an object by vibrating the protection portion 92 or the belt 94 with use of a vibration motor or the like in accordance with an ultrasonic wave emitted by the frame 80 which is a main body of the bicycle. Thus, the bicyclist can recognize the existence of an object easily, which can obviate danger.

(Notes on the Description of the Specification and the Like)

The following are notes on the description of the above embodiments and structures in the embodiments.

One embodiment of the present invention can be constituted by combining the structure described in an embodiment with any of the structures described in the other embodiments as appropriate. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The voltage refers to a potential difference from a reference potential. When the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film," "layer," and the like can be interchanged with each other depending on circumstances or conditions. For example, the term "conductive layer" can be changed into the term "conductive film" in some cases. Moreover, the term "insulating film" can be changed into the term "insulating layer" in some cases.

In this specification and the like, a switch is conducting or not conducting (is turned on or off) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

REFERENCE NUMERALS

F11: node, F12: node, F13: node, REF1: reference signal, REF3: reference signal, S11: selection signal, S12: selection signal, S111: selection signal, S112: selection signal, S121: selection signal, S122: selection signal, S131: selection signal, S132: selection signal, SSEL_1: signal, SSEL_2: signal, SSEL_21: signal, ST72: dicing step, T1: time, T2: time, T4: time, T5: time, T6: time, T7: time, T8: time, W11: selection signal, W12: selection signal, W13: selection signal, 10: housing, 11: arithmetic circuit, 12: transmission circuit, 12A: transmission circuit, 12B: transmission circuit, 13: receiving circuit, 13A: receiving circuit, 13B: receiving circuit, 14: transmission circuit, 20: housing, 21: receiving circuit, 22: control circuit, 23: vibration motor, 30: object, 31: ultrasonic wave, 31A: ultrasonic wave, 31B: ultrasonic wave, 32: ultrasonic wave, 32A: ultrasonic wave, 32B: ultrasonic wave, 33: ultrasonic wave, 40: signal generation circuit, 41: delay circuit, 41A: delay circuit, 41B: delay circuit, 42: signal processing circuit, 50: reference signal generation circuit, 51: differential circuit, 51_1: differential circuit, 51_9: differential circuit, 51A: differential circuit, 51B: differential circuit, 52: integration circuit, 52_1: integration circuit, 52_9: integration circuit, 53: comparator, 53_1: comparator, 53_9: comparator, 54: triangular wave generation circuit, 55: arithmetic circuit, 61: resistor, 62: resistor, 63: transistor, 63A: transistor, 63B: transistor, 64:

transistor, 65: transistor, 65A: transistor, 65B: transistor, 71: diode, 72: resistor, 73: operational amplifier, 74: capacitor, 75: switch, 80: frame, 81: watch-type electronic terminal, 82: display portion, 83: electronic component, 84: belt, 91: helmet, 92: protection portion, 93: electronic component, 94: belt, 100: driver alert system, 111: selection circuit, 112: signal retention circuit, 112_1: signal retention circuit, 112_2: signal retention circuit, 113: selection circuit, 121: transistor, 121A: transistor, 121B: transistor, 122: transistor, 123: transistor, 124: transistor, 124A: transistor, 124B: transistor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 510: insulator, 512: insulator, 514: insulator, 516: insulator, 518: conductor, 520: insulator, 522: insulator, 524: insulator, 526: insulator, 530: oxide, 530a: oxide, 530b: oxide, 530c: oxide, 540a: conductor, 540b: conductor, 542: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 7000: electronic component, 7001: lead, 7002: printed board, 7004: circuit board, 7100: semiconductor wafer, 7102: circuit region, 7104: separation region, 7106: separation line, 7110: chip

The invention claimed is:

1. A driver alert system comprising:
   a first housing comprising:
      a first transmission circuit transmitting a first ultrasonic wave;
      a first receiving circuit receiving a second ultrasonic wave;
      an arithmetic circuit detecting the presence or absence of an object from the second ultrasonic wave; and
      a second transmission circuit transmitting a third ultrasonic wave on the basis of a signal obtained in the arithmetic circuit; and
   a second housing comprising a second receiving circuit receiving the third ultrasonic wave,
   wherein the arithmetic circuit comprises a first selection circuit selecting a potential based on the second ultrasonic wave at a different timing; a plurality of signal retention circuits retaining a potential based on the second ultrasonic wave; a second selection circuit selecting any one of the plurality of signal retention circuits; and a signal processing circuit to which a signal selected in and output from the second selection circuit is input;
   wherein each of the plurality of signal retention circuits comprises a first transistor,
   wherein the second ultrasonic wave is an ultrasonic wave obtained by reflection of the first ultrasonic wave,
   wherein the first transistor comprises a semiconductor layer comprising an oxide semiconductor in a channel formation region,
   wherein the second selection circuit selects the plurality of signal retention circuits at different timings to generate a signal obtained by delaying the second ultrasonic wave, and
   wherein the third ultrasonic wave generated on the basis of the signal is transmitted to the second housing.

2. A driver alert system comprising:
   a first housing comprising:
      a first transmission circuit transmitting a first ultrasonic wave;
      a first receiving circuit receiving a second ultrasonic wave;
      a second transmission circuit transmitting a third ultrasonic wave;
      a second receiving circuit receiving a fourth ultrasonic wave;
      an arithmetic circuit detecting the presence or absence of an object from the second ultrasonic wave and the fourth ultrasonic wave; and
      a third transmission circuit transmitting a fifth ultrasonic wave on the basis of a signal obtained in the arithmetic circuit; and
   a second housing comprising a third receiving circuit receiving the fifth ultrasonic wave,
   wherein the arithmetic circuit comprises a first selection circuit selecting a potential based on the second ultrasonic wave or the fourth ultrasonic wave at a different timing; a plurality of signal retention circuits retaining a potential based on the second ultrasonic wave or the fourth ultrasonic wave; a second selection circuit selecting any one of the plurality of signal retention circuits; and a signal processing circuit to which a signal selected in and output from the second selection circuit is input;
   wherein the second ultrasonic wave is an ultrasonic wave obtained by reflection of the first ultrasonic wave,
   wherein the fourth ultrasonic wave is an ultrasonic wave obtained by reflection of the third ultrasonic wave,
   wherein each of the plurality of signal retention circuits comprises a first transistor,
   wherein the first transistor comprises a semiconductor layer comprising an oxide semiconductor in a channel formation region,
   wherein the second selection circuit selects the plurality of signal retention circuits at different timings to generate a signal obtained by delaying the second ultrasonic wave or the fourth ultrasonic wave, and
   wherein the fifth ultrasonic wave generated on the basis of the signal is transmitted to the second housing.

3. The driver alert system according to claim 1, wherein the first transistor functions as a selection switch in the first selection circuit.

4. The driver alert system according to claims 1 to 3 claim 1,
   wherein each of the plurality of signal retention circuits comprises an amplifier circuit including a second transistor, and
   wherein the second transistor comprises a semiconductor layer comprising an oxide semiconductor in a channel formation region.

5. The driver alert system according to claim 1,
   wherein the second selection circuit comprises a third transistor, and
   wherein the third transistor comprises a semiconductor layer comprising an oxide semiconductor in a channel formation region.

6. The driver alert system according to claim 1,
   wherein the signal processing circuit comprises a differential circuit, an integration circuit, a comparator, and a triangular wave generation circuit, wherein a first voltage and a second voltage are input to the differential circuit, wherein an output signal of the differential circuit is input to the integration circuit, and wherein an output signal of the integration circuit and an output signal of the triangular wave generation circuit are input to the comparator.

7. The driver alert system according to claim 1, wherein the differential circuit comprises a fourth transistor, and wherein the fourth transistor comprises a semiconductor layer comprising an oxide semiconductor in a channel formation region.

8. The driver alert system according to claim 2, wherein the first transistor functions as a selection switch in the first selection circuit.

9. The driver alert system according to claim 2, wherein each of the plurality of signal retention circuits comprises an amplifier circuit including a second transistor, and wherein the second transistor comprises a semiconductor layer comprising an oxide semiconductor in a channel formation region.

10. The driver alert system according to claim 2, wherein the second selection circuit comprises a third transistor, and wherein the third transistor comprises a semiconductor layer comprising an oxide semiconductor in a channel formation region.

11. The driver alert system according to claim 2, wherein the signal processing circuit comprises a differential circuit, an integration circuit, a comparator, and a triangular wave generation circuit, wherein a first voltage and a second voltage are input to the differential circuit, wherein an output signal of the differential circuit is input to the integration circuit, and wherein an output signal of the integration circuit and an output signal of the triangular wave generation circuit are input to the comparator.

12. The driver alert system according to claim 2, wherein the differential circuit comprises a fourth transistor, and wherein the fourth transistor comprises a semiconductor layer comprising an oxide semiconductor in a channel formation region.

* * * * *